United States Patent [19]

Gontowski, Jr. et al.

[11] Patent Number: 4,494,088
[45] Date of Patent: Jan. 15, 1985

[54] OSCILLATOR WITH CAPACITOR CHARGED AND DISCHARGED BY CURRENT PROPORTIONAL TO A REFERENCE CURRENT

[75] Inventors: Walter S. Gontowski, Jr., Thompson, Conn.; George E. Rollins, Holden, Mass.

[73] Assignee: Sprague Electric Company, North Adams, Mass.

[21] Appl. No.: 401,505

[22] Filed: Jul. 26, 1982

[51] Int. Cl.³ .................. H03K 3/282; H03K 4/52
[52] U.S. Cl. .................... 331/111; 331/113 R
[58] Field of Search ................ 331/111, 113 R

[56] References Cited
U.S. PATENT DOCUMENTS 4,374,366 2/1983 McGinn ..................... 331/111
4,418,323 11/1983 Tokumo et al. ............... 331/111

Primary Examiner—Siegfried H. Grimm

[57] ABSTRACT

A silicon integrated oscillator circuit is connected with a capacitor and produces a highly precise and stable triangular output voltage. Both the charge current and the discharge current are proportional to one reference current. A switching circuit terminates the charge and discharge intervals when the capacitor voltage reaches a level that is equal to intermediate points on first and second resistive-voltage-divider circuits, respectively. This is accomplished by a differential-transistor-pair comparator having the base of one transistor connected to a high voltage one of the reference points and a third transistor, which is connected collector to emitter across the one transistor, having a base connected to a low voltage one of the reference points.

2 Claims, 2 Drawing Figures 4,494,088

OSCILLATOR WITH CAPACITOR CHARGED AND DISCHARGED BY CURRENT PROPORTIONAL TO A REFERENCE CURRENT

BACKGROUND OF THE INVENTION

This invention relates to an integrated circuit that with a stable capacitor attached becomes a stable oscillator, and more particularly pertains to such an oscillator wherein the capacitor charging and discharging currents are each proportional to a reference current from a current source.

Such an oscillator is described in the patent application to Gontowski Ser. No. 296,749 filed Aug. 27, 1981 that matured into the U.S. Pat. No. 4,450,415 on May 22, 1984 and is assigned to the same assignee as is the present application. A reference current source is provided in the integrated circuit. The reference current is switched back and forth between two differentially connected transistors to, respectively, charge and discharge the capacitor. The bases of the two differentially connected transistors are, respectively, connected to the capacitor and an intermediate voltage point in a voltage divider.

The capacitor charge interval terminates when the capacitor voltage reaches the intermediate voltage. During the subsequent discharge interval, the voltage at the voltage divider intermediate point is reduced by activating a transistor to shunt part of the divider. The discharge interval terminates when the capacitor voltage reaches the above noted reduced voltage.

That reduced voltage is dependent upon $V_{(SAT)}$ of the shunting transistor. When it is desired to operate the oscillator at a low supply voltage, the shunt-transistor $V_{(SAT)}$ becomes an especially significant factor in the determination of the peak-to-peak voltage across the oscillating capacitor and thus a more significant factor determining the frequency of oscillation. Such transistor saturation voltages collector-to-emitter, $V_{(SAT)}$, vary from piece to piece due to variations in integrated circuit (IC) processing and vary as a function of temperature (typically +0.1 MV/°C.) and collector current which in turn is a function of DC supply voltage.

It is an object of the present invention to provide an oscillator, capable of being formed in an integrated circuit except for an external capacitor, providing a more stable operation with temperature and supply voltage, and providing more uniform performance piece to piece at the end of the IC production line.

SUMMARY OF THE INVENTION

A stable integrated oscillator circuit is adapted for connection with a capacitor and a DC power supply. The integrated circuit includes a current source for generating a reference current that may be about proportional to the supply voltage. A charging circuit means is for charging the capacitor with a charge current that is proportional to the reference current. A discharging circuit means is for discharging the capacitor with a discharge current that is proportional to the reference current. A charge-interval termination means includes a first voltage divider network connected across the DC supply terminals of the integrated circuit chip for terminating the charging when the capacitor voltage reaches a value substantially equal to that at an intermediate point in the first divider. A dischargeinterval termination means includes a second voltage divider network connected across the DC supply terminals and having a junction at which the voltage is less than that at said point for terminating the discharging when the capacitor voltage drops below a voltage that is substantially equal to the voltage at said junction.

Both charge and discharge currents are proportional to the reference current. When the reference current is about proportional to the supply voltage, so are the rates of charging and discharging. Since the two voltage dividers determine the capacitor voltage high and low peak values, and since they are proportional to supply voltage, the frequency of oscillation is nearly invariant with changes in supply voltage. Also the low peak value of capacitor voltage is no longer a function of a transistor $V_{(SAT)}$ value and so oscillator operation is more stable with changes in supply voltage and temperature.

DECRIPTION OF THE PREFERRED EMBODIMENTS

Figure 1:
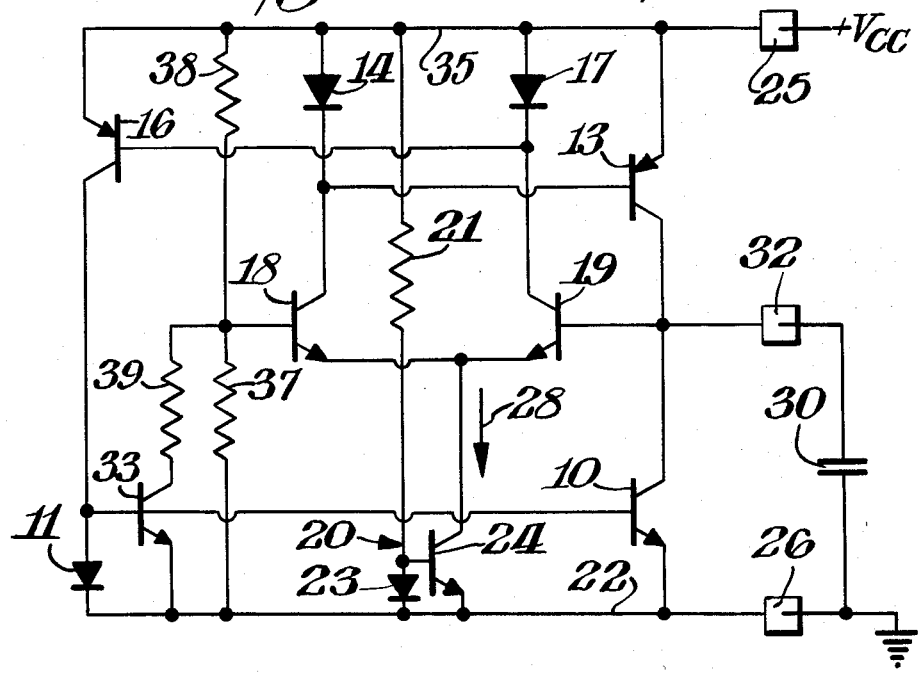
FIG. 1 shows a circuit diagram of an integrated oscillator circuit of the prior art connected with a capacitor.

In the prior-art osciallator of FIG. 1 there appear three current-mirror circuits, namely a first made up of transistor 10 and diode 11, a second made up of transistor 13 and diode 14 and a third made up of transistor 16 and diode 17. The diodes, 11, 14 and 17 in each current-mirror circuit represent an input device in the input branch for which the corresponding transistors 10, 13 and 16, respectively, are the output transistors in the output branches of the current-mirror circuits.

In a current-mirror circuit, the output current at the collector of the output transistor (e.g. 13) is directly proportional to the input current caused to flow through the input device (e.g. diode 14), as the ratio of the base-emitter-junction area in the output transistor (13) over the junction area of the input device (14). The gain controlling junction area ratios in each of these three current-mirror circuits are considered here to be unity, and thus a unity current "gain" will be assumed in the following discussion of the circuit of FIG. 1.

A pair of transistors 18 and 19 are arranged in differential amplifier configuration with a current source 20 connected from their emitters to the ground bus 22. Current-mirror input-branch diodes 14 and 17 serve as collector loads for transistors 18 and 19, respectively. When a positive DC supply voltage is first applied to terminal 25 relative to ground terminal 26, transistor 18 turns on to switch the current 28 from current source 20 through diode 14. Current source 20 consists of resistor 21, diode 23 and transistor 24. A capacitor 30 connected to terminals 32 and 26, having zero initial charge holds transistor 19 off. Since at that first instant diode 14 conducts, then so does transistor 13 and a capacitor charging current is produced in the collector of transistor 13 that equals current 28. At the first instant of turning on the power supply voltage (Vcc at bus 35) transistor 19 and diode 17 are not conducting and thus neither are transistor 16, transistor 33, diode 11 and transistor 10.

During this first operating interval, when the capacitor 30 charges to a voltage that is greater than the voltage at the base of transistor 18, that is determined by the voltage divider consisting of resistors 37 and 38, then transistor 19 turns on. This leads to turning on transistors 16, 33 and 10, to begin a second operating interval.

In the second interval, transistor 33 and resistor 39 shunt resistor 37, lowering the voltage at the base of transistor 18 between resistors 37 and 38. This causes transistor 18 to turn off. Capacitor 30 is discharged at a rate exactly equal that to which it was charged in the previous operating interval. The rates of charge and discharge are thus equal here, both being determined by the magnitude of reference current 28.

The second operating interval terminates when the voltage across capacitor 30 drops to a value about equal to the low bias voltage at the junction of bias resistors 37 and 38, with resistor 39 shunting resistor 37 through transistor 33. The third operating interval then begins with all transistors nearly in the same state as for the first interval.

Thus the operation of this circuit is essentially the same as that for the circuit described in the aforesaid patent application.

Figure 2:
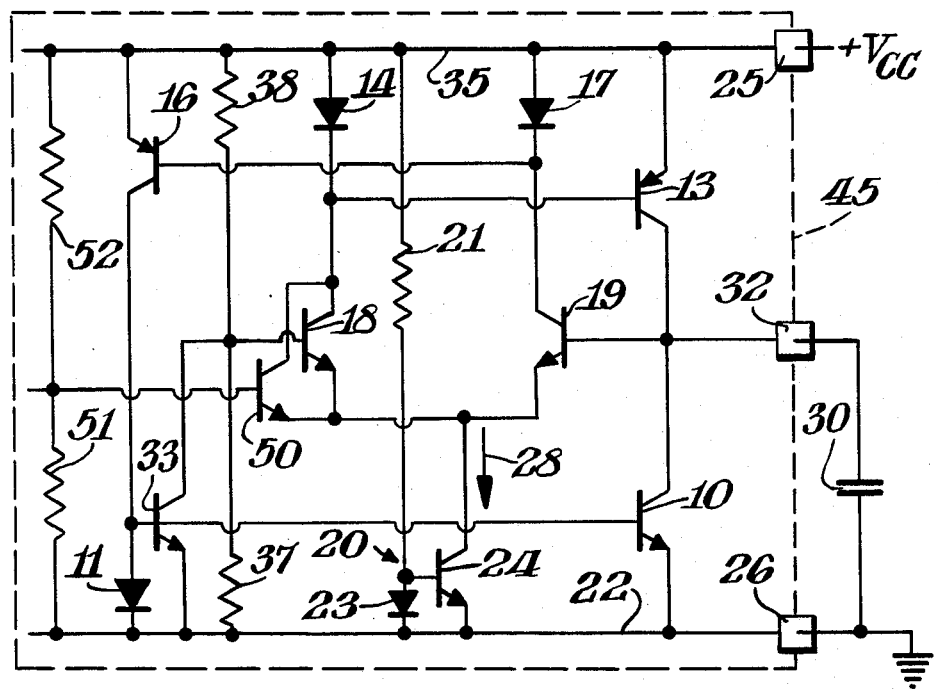
FIG. 2 shows a circuit diagram of an integrated oscillator circuit of this invention connected with a capacitor.

The integrated circuit of FIG. 2, indicated as that portion within the dashed line 45, is the same as in FIG. 1 except for the elimination of the resistor 39 and the addition of transistor 50 and the voltage divider resistors 51 and 52.

In the improved circuit of FIG. 2 the "second" interval, during which the capacitor 30 discharges, is now terminated each time the capacitor voltage drops to the level of the bias voltage which appears at the junction of the voltage-dividing resistors 51 and 52. This bias voltage is, of course, not dependent upon the drop, i.e. collector-to-emitter voltage, of transistor 33 and so the lower peak value of the capacitor voltage waveform is dependent upon the bias voltage at the intermediate junction of the resistors-51-and-52 divider while the upper peak voltage of the capacitor voltage waveform depends upon the intermediate junction voltage of the resistors-37-and-38 divider.

Furthermore, it is essential for the circuit of FIG. 1 to operate at all that resistor 39 be included to provide only a partial shunting by transistor 33 of voltage-divider resistor 37. Otherwise, when transistor 33 turns on, the voltage at the base of transistor 18 would be near zero during an interval that capacitor 30 discharges. Capacitor 30 would have to discharge to that near zero voltage in order to turn off transistor 19 and terminate that discharge cycle. However, before it could reach that low voltage, since the collector of current-source transistor 24 would be one $V_{BE}$ (base-emitter voltage of transistor 19) lower than the capacitor voltage, the current source would be disabled and the circuit would cease to oscillate. There is no need for a resistor 39 in the circuit of FIG. 2 since during the discharge interval transistor 18 is held firmly off and finally transistor 50 turns on when the capacitor voltage reaches the intermediate junction voltage (at base of transistor 50) of the resistors 51 and 52 divider to terminate each discharge interval.

Thus both the saturation voltage $V_{(SAT)}$ of transistor 33 and the resistance of resistor 39 are eliminated in the circuit of this invention as variables influencing output amplitude and frequency. Both the upper peak and lower peak values of the output voltage across capacitor 30 depend upon resistor ratios, namely the resistor ratios of resistors 37 and 38, and of resistors 51 and 52.

Now for each percent that the power supply voltage changes, e.g. increases, the upper and lower peaks of the output voltage change by that one percent and the peak to peak value of output voltage changes, e.g. increases, by one percent. At the same time the reference current 28 from the current source also changes, e.g. increases, one percent and the frequency of oscillation remains almost constant. It is not exactly constant mainly because the reference current 28 is not exactly proportional to supply voltage owing to the $V_{BE}$ drop across diode 23. This could be overcome by reconnecting the top ends of resistors 52 and 38 through a diode (not shown) to the +Vcc terminal 25.

For a given set of conditions that lead to the same output amplitude using the same power supply voltage, the stability of the circuit of this invention (FIG. 2) is greater than for the circuit of FIG. 1.

For example, voltage divider resistors had values shown in the Table.

| resistor | Value (ohms) |
| --- | --- |
| 38 | 1K |
| 37 | 2K |
| 39 | 530 |
| 52 | 2K |
| 51 | 1K |

With Vcc=+3 volts, the measured drop $V_{(SAT)}$ across transistor 33 was 200 MV in both circuits. The peak amplitudes of the sawtooth waveform of voltage across the capacitor 30 was in both circuits: upper peak 2 volts and lower peak 1 volt (peak to peak 1 volt). As a result of artificially changing the $V_{(SAT)}$ across transistor 33 from 200 MV to 300 MV, the change in the peak to peak transistor voltage is 5% in the circuit of FIG. 1 while the change is essentially 0% in the circuit of FIG. 2.

What is claimed is:

1. A stable silicon integrated oscillator circuit for connection to a discrete capacitor comprising:

a pair of DC power supply busses;

a charger current-mirror circuit having an output branch connected in a series circuit with said capacitor which series circuit is connected between said pair of DC supply busses;

a discharger current-mirror circuit having an output branch connected in parallel with said capacitor;

a current source for producing a reference current; and a switching circuit portion comprising a pair of differentially-connnected transistors, said current source being connected between one of said power supply busses and the emitters of said differentially-connected transistors, the input branches of said charger and discharger current mirror circuits being respectively connected in the collector circuits of one and another of said pair of differentially-connected transistors; yet another transistor being parallel connected, collector-to-collector and emitter-to-emitter, with said one transistor; first and second resistive voltage dividers connected across said pair of DC busses having high and low intermediate voltage points, respectively, being connected to the bases of said one and yet another transistors, respectively, for determining the high peak and low peak values of the oscillating voltage across said capacitor, respectively; and a transistor switch means for shunting a portion of said first divider to reduce the voltage at said high intermediate voltage point during intervals when said capacitor discharges.

2. The integrated oscillator circuit of claim 1 wherein said transistor switch means comprises a transistor connected, collector-to-emitter, directly between the base of said one transistor and said one DC bus.

* * * * *